United States Patent [19]

McCain

[11] Patent Number: 5,153,710

[45] Date of Patent: Oct. 6, 1992

[54] INTEGRATED CIRCUIT PACKAGE WITH LAMINATED BACKUP CELL

[75] Inventor: Joseph H. McCain, Plano, Tex.

[73] Assignee: SGS-Thomson Microelectronics, Inc., Carrollton, Tex.

[21] Appl. No.: 736,412

[22] Filed: Jul. 26, 1991

[51] Int. Cl.$^5$ .............. H01L 23/16; H01L 23/48; H01L 29/44; H01L 29/60

[52] U.S. Cl. ............................ 357/75; 357/70; 357/72; 365/228; 365/229

[58] Field of Search ............... 357/75, 70, 72; 365/226, 227, 228, 229; 320/6, 49; 136/249, 250, 251; 429/123, 124, 127, 162

[56] References Cited

U.S. PATENT DOCUMENTS

| | | | |
|---|---|---|---|
| 3,353,999 | 11/1967 | Osborn | 429/127 |
| 3,375,136 | 3/1968 | Biggar | 429/127 |
| 4,623,598 | 11/1986 | Waki et al. | 429/162 |
| 4,982,371 | 1/1991 | Bolan et al. | 365/228 |
| 5,055,704 | 10/1991 | Link et al. | 365/229 |
| 5,091,771 | 2/1992 | Bolan et al. | 365/228 |

Primary Examiner—Andrew J. James
Assistant Examiner—Carl Whitehead, Jr.
Attorney, Agent, or Firm—Dennis T. Griggs; Lisa K. Jorgenson; Richard K. Robinson

[57] ABSTRACT

An integrated circuit package encapsulates a memory chip and a laminated backup battery for preserving data in the event of loss of main power supply. The package includes a lead frame assembly encapsulated within a body of non-conductive material, with the memory chip being mounted onto a device support plate on one side of the lead frame. The laminated battery is supported beneath the device support plate on the opposite side of the lead frame. A flat geometry interconnect media connects the electrodes of the laminated backup battery for wire bond interconnection with the positive and negative power input nodes of the memory chip. The interconnect media is in the form of a flexible, laminated strip having a central conductive laminate sandwiched between a pair of insulation laminates. The integrated circuit chip, the laminated battery, the interconnected media, the lead frame assembly and the gold interconnect wires are completely encapsulated within the molded package body.

15 Claims, 3 Drawing Sheets

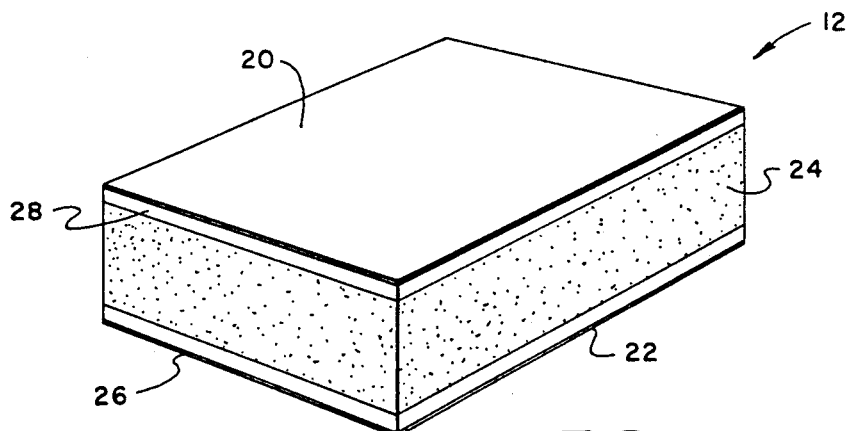
FIG. 1
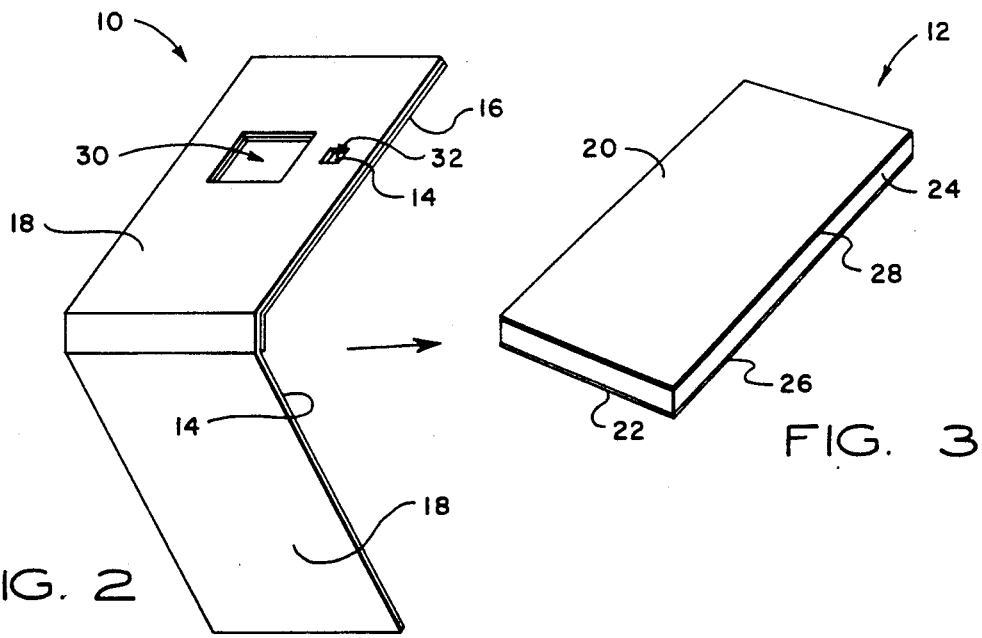
FIG. 2
FIG. 3
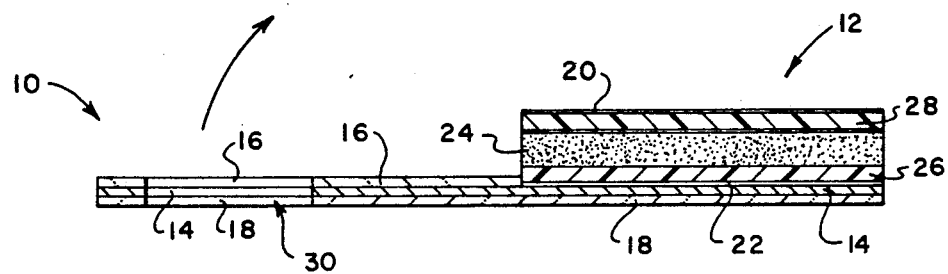
FIG. 4

INTEGRATED CIRCUIT PACKAGE WITH LAMINATED BACKUP CELL

FIELD OF THE INVENTION

This invention relates generally to packaging for semiconductor devices, and in particular to an integrated circuit package for encapsulating a semiconductor integrated circuit memory chip and a laminated backup battery for preserving memory data in the event of loss of main power supply.

BACKGROUND OF THE INVENTION

Conventional electronic circuit packages for semiconductor integrated circuit chips are adapted to enclose and seal the chip devices, while also providing heat dissipation, structural support, electrical attachment of device leads to external pin connectors, and electrical interconnection with other devices in the package. Such packages may be formed of one or more layers of an insulating material, with the semiconductor chip being embedded within one of the layers. Flexible metal leads are extended from an interconnect region surrounding the chip to edge mounted connector pins for connecting the device input/output terminals to a printed circuit board socket in a host electronic circuit.

An important integrated circuit product which is implemented on an IC chip encapsulated within an integrated circuit package includes a volatile semiconductor memory such as the static random access memory (SRAM) which is characterized by low standby power consumption and high memory cell density. The generation of valid logic signals and the retention of data in such integrated memory circuits depend in part on maintenance of power supply voltages within specified limits. In conventional integrated circuit memory devices, internal circuits sense the external source voltage being applied to determine if it is sufficient for reliable operation. In response to a low voltage condition, control signals are generated which cause active chips to be de-selected and maintained in standby condition. This is usually carried out by means of true and complement chip select signals, CS and $\overline{CS}$, respectively, which inhibit read/write operations until the low voltage condition has been corrected.

During the period that a memory chip is in the unselected condition it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be reestablished.

DESCRIPTION OF THE PRIOR ART

It has been proposed to solve the data loss problem by using an additional pin terminal on memory semiconductor circuits and that the additional terminal will be supplied with backup power from a remote source to maintain the data in the memory cells. However, there are now established standardized pin patterns for certain categories of integrated circuit memories; consequently, the addition of another pin dedicated to a remote backup power supply would not be compatible with such standard pin patterns, and would require a substantial redesign of existing circuits.

Accordingly, there exists a need for a semiconductor memory package for encapsulating a memory chip and a backup battery wherein the socket area and standard pin configuration are not affected, and stored data are retained despite a loss of the main power supply.

A substantial portion of the cost and size of a packaged chip is attributable to package fabrication, and two important design criteria in addition to providing a reliable electrical connection are cost effectiveness and space efficiency. A need thus exists for an improved device package for encapsulating an integrated circuit chip and a backup battery wherein the packaging height and volume are no greater than conventional device packages.

Some packages for integrated circuit memory devices include a battery molded within one half section of a two-part package. In that construction, a chip is loaded onto the base plate of a lead frame and wires are bonded between I/O pads and respective internal leads. The mold is heated, and molding resin is then injected into the heated mold cavity. Consequently, the lead frame and IC chip are encapsulated by the resin within one molded half section. A small battery and other discrete components, for example a crystal, are mounted within a second half section. The second half section includes connector pins accurately positioned for engaging finger leads in the lead frame of the first molded half section. The dual section arrangement has served well for many product applications. However, the additional height imposed by the second half section produces a package which exceeds the maximum height limit established for critical space, high density product applications.

Accordingly, a need thus exists for an improved device package in which a semiconductor circuit device, a lead frame assembly and a backup battery are encapsulated within a single molded body of non-conductive material, wherein the packaging height dimension is substantially less than the height of conventional two-part device packages which include a backup battery.

The data loss problem has been solved in some conventional through-hole printed circuit (PC) boards by installing a conventional secondary cell, for example, a nickel-cadmium "button" cell in an external socket mounted on a through-hole PC circuit board. In some applications, the battery electrodes are equipped with solder tags, and others are connected by wire conductors to positive and negative power terminals on the printed circuit board. Such socket and wire connections are not well adapted to automatic assembly techniques used in the fabrication of high density printed circuit boards.

Recently, an improved rechargeable laminated battery has been demonstrated. The rechargeable battery utilizes a solid polymer electrolyte core laminated between polymer film cathode material and polymer film anode material. The contact electrodes are formed by conductive film laminations as well.

The flat geometry, package height and ampere hour charge capacity of such solid polymer electrolyte secondary cells are well suited for use as a backup battery for integrated circuit memory devices. However, since their electrodes are not coplanar, a compatible coupling media is needed to adapt such rechargeable, conductive polymer batteries for use in combination with the copla-

SUMMARY OF THE INVENTION

The present invention provides an improved package for encapsulating an integrated circuit device and a laminated backup battery, and it overcomes the foregoing conventional backup battery limitations by mounting the integrated circuit device on a die paddle plate on one side of a finger lead assembly, and by mounting a laminated polymer battery on the opposite side of the die paddle plate.

The laminated backup battery is coupled to the IC chip by an electrical interconnect media in the form of a flexible, laminated strip having a central conductive laminate sandwiched between a pair of insulation laminates. The multi-layer laminated strip is flexible so that it can be folded about the anode and cathode of the laminated power source for presenting positive and negative battery terminals in substantially coplanar relation for electrical wire bond contact with the DC power input/output nodes of the IC chip.

In the preferred embodiment, a section of insulation laminate is removed and the cathode of the battery is loaded on and electrically bonded to the exposed conductive laminate. An intermediate section of the flexible interconnect media is folded around the edge of the laminated battery, with the conductive laminate being separated from the battery anode by the insulation laminate. The laminations of the interconnect media are intersected by an aperture, which exposes the underlying battery anode. The outer insulation laminate is also intersected by an aperture, thereby exposing the conductive laminate, which is in electrical contact with the battery cathode. Interconnect wires are bonded to the exposed battery anode and the exposed conductive laminate, and to the power I/O nodes of the integrated circuit chip. The flexible interconnect media thus constitutes an electrical wrap which simultaneously insulates the battery cathode with respect to the anode, while presenting positive and negative contact surfaces substantially in coplanar relationship for wire bond interconnection with the IC chip I/O nodes.

The integrated circuit device substrate is bonded to the die paddle plate by a layer of conductive adhesive. The laminated battery and interconnect media are bonded to the underside of the die paddle plate. The laminated backup battery, integrated circuit device and lead frame assembly are totally enclosed within the molded body of the package, without altering the socket area or the pin configuration. The package height is substantially reduced with respect to the two part package described above.

Operational features and advantages of the present invention will be appreciated by those skilled in the art upon reading the detailed description which follows with reference to the attached drawings, wherein:

BRIEF DESCRIPTION OF THE DRAWINGS

FIG. 1 is a perspective view of a solid polymer electrolyte secondary cell;

FIG. 2 is a perspective view of a laminated interconnect media shown in a partially folded condition in preparation for folding attachment to a laminated power source;

FIG. 3 is a simplified perspective view of a laminated power source;

FIG. 4 is a sectional view which illustrates loading the cathode of a laminated power source onto the exposed conductive laminate of the interconnect media shown in FIG. 2;

DETAILED DESCRIPTION OF THE PREFERRED EMBODIMENT

Figure 5:
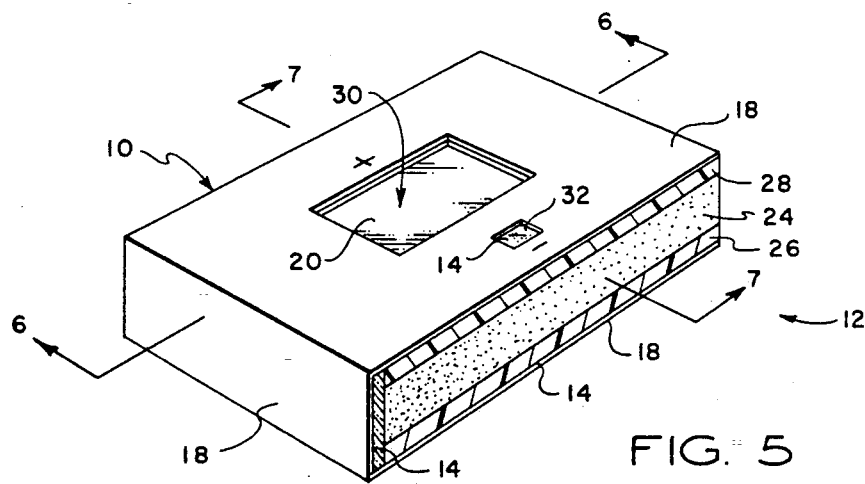
FIG. 5 is a perspective view of a laminated power source loaded between the folded sections of the laminated interconnect media of FIG. 2.

In the description which follows, like parts are indicated throughout the specification and drawings with the same reference numerals, respectively. By way of example, the invention is described in combination with a laminated, rechargeable solid polymer battery for providing backup power to a static random access memory (SRAM) device encapsulated in a surface-mountable PLCC package. It will be appreciated, however, that the interconnect media and laminated battery combination of the invention may be used to provide backup battery power for other volatile memory integrated circuit devices having multiple input/output nodes. Accordingly, it should be understood that the invention and its broadest aspects may be utilized in combination with laminated power sources in general and other circuit devices which require backup power, including but not limited to discrete, micro-discrete and integrated circuit components, and hybride combinations of such discrete and integrated devices.

Referring now to FIG. 1-FIG. 4, a laminated interconnect media 10 is adapted for folding engagement about a laminated power source 12. The interconnect media 10 is in the form of a flexible, laminated strip having a central conductive laminate 14 sandwiched between a pair of insulation laminates 16, 18. In the preferred embodiment, the conductive laminate 14 is a foil or metallized film of a conductive metal such as copper, silver or aluminum. The insulation laminate is preferably paper or a non-conductive polyester film such as Mylar ® or Kapton ® manufactured by E. I. DuPont de Nemours & Co. The insulation laminates 16, 18 are bonded to the conductive laminate 14 by a heat sealing adhesive. The multi-layer laminated strip 10 is flexible so that it can be folded about the anode 20 and cathode 22 of the laminated battery 12.

The laminated power source 12 shown in FIG. 1 is a solid polymer, rechargeable secondary cell. A film composition of lithium perchlorate ($LiClO_4$) mixed with polyvinylidene ($LiClO_4$-PVDF). constitutes the solid electrolyte 24. The solid electrolyte 24 is sandwiched between two polyacetylene $(CH)_x$ films 26, 28 which define cathode and anode electrolyte layers 26, 28. The cathode electrolyte layer 26 is impregnated with n-type impurities for enhanced conductivity. The cathode film layer is bonded to a laminated aluminum film 26 which constitutes the negative terminal. The anode layer 28 is impregnated with p-type impurities for enhanced conductivity. A 2,000 Å evaporated gold film is deposited on the anode surface, and constitutes the positive terminal 20.

The laminated anode terminal 20 and the laminated cathode terminal 22 are not coplanar; consequently, the interconnect media 10 is folded onto the anode and cathode for presenting positive and negative battery terminals for wiring interconnection with input/output nodes of an integrated circuit chip as described below.

Referring to FIG. 4, a section of insulation laminate is removed from the insulation laminate 16, thereby exposing the surface of the conductive laminate 14. The cathode 22 of the battery 12 is loaded onto and bonded by a deposit of conductive adhesive to the exposed surface of the conductive laminate 14. The flexible interconnect media 10 is then folded around the edge of the laminated battery, with the conductive laminate 14 being separated from the battery anode 20 by the insulation laminate 16.

The laminations of the interconnect media 10 are intersected by a first aperture 30, which exposes the underlying battery anode 20. The outer insulation laminate 18 is intersected by a second aperture 32, thereby exposing the conductive interconnect laminate 14.

Figure 6:
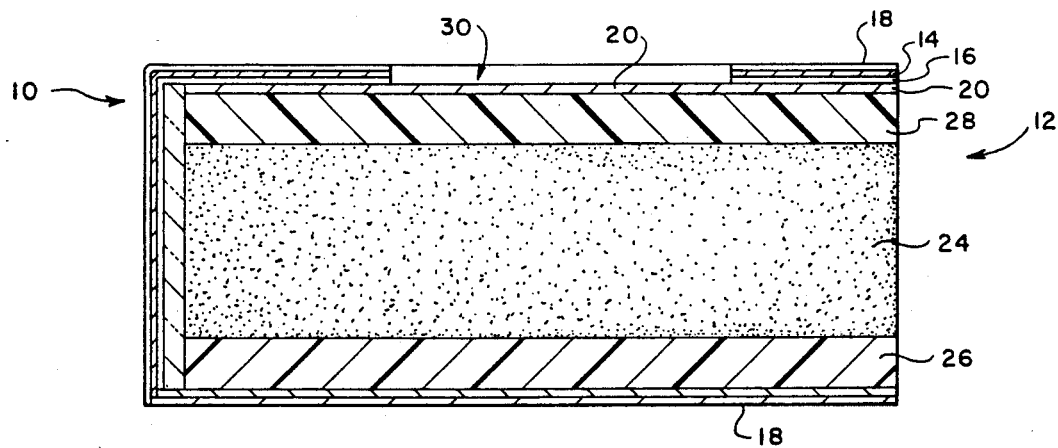
FIG. 6 is a sectional view of the laminated power source and interconnect media shown in FIG. 5, taken along the line 6—6.
Figure 7:
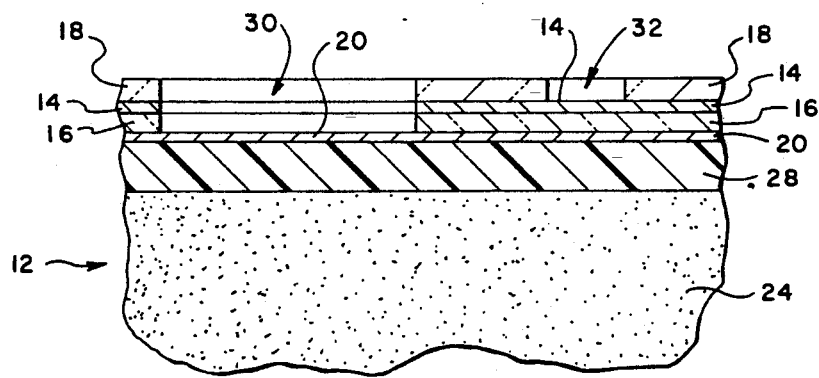
FIG. 7 is an enlarged sectional view which illustrates coplanar exposure of the anode and the conductive laminate of the interconnect media taken along the line 7—7.
Figure 10:
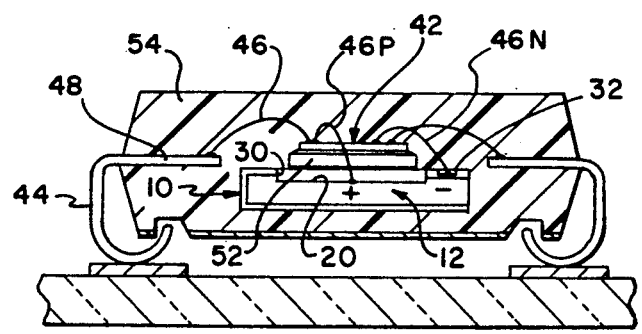

Referring to FIG. 5, FIG. 6 and FIG. 7, the battery anode surface 20 exposed by the aperture 30 and the conductive laminate 14 exposed by the aperture 32 present positive and negative battery terminals in substantially coplanar relation for wire bond interconnection by gold wires which attach to I/O power input nodes of an integrated circuit device (FIG. 10). The flexible interconnect media 10 simultaneously insulates the battery cathode 22 with respect to the anode 20, while presenting electrical contact surfaces 14, 20 substantially in coplanar relation for wire bonding.

Figure 8:
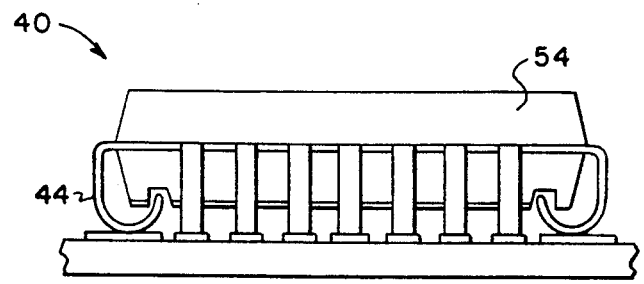
FIG. 8 is a side elevational view of a surface mountable plastic leadless chip carrier (PLCC) memory device in which the laminated battery and interconnect media of FIG. 5 are encapsulated.
Figure 9:
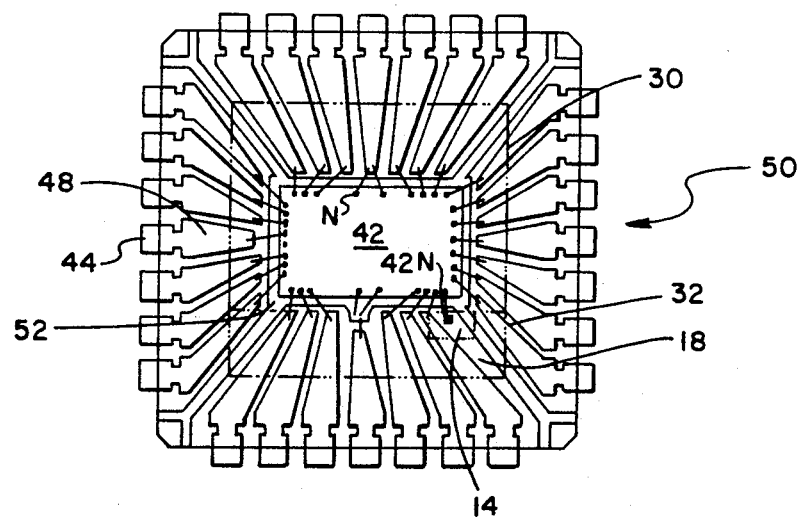
FIG. 9 is a top plan view of a lead frame and semiconductor chip mounted on the insulated surface of the laminated battery and interconnect media; and, FIG. 10 is a side sectional view of the semiconductor chip circuit, laminated battery and lead frame assembly of FIG. 9 in a unitary molded PLCC package.

Referring now to FIG. 8, FIG. 9 and FIG. 10, there is shown an exemplary semiconductor chip package 40 in which the laminated battery and interconnect media of the present invention are encapsulated. The package 40 is a 28-pin, surface-mountable, plastic, leadless chip carrier (PLCC) package 42 which supports and encapsulates an integrated circuit chip 42. The IC chip 40 may be, for example a 2K×8 static random access memory circuit which is characterized by low power consumption, high memory cell density and which is implemented on an N-type silicon substrate by complementary metal oxide semiconductor (CMOS) technology.

The exemplary package 10 has external J-leads 44 arranged in four groups with 20 mil spacing along the longitudinal edges of the package. The input/output nodes 42 of the integrated circuit chip 40 are electrically connected by gold interconnect wires 46 to selected J-leads 44 of a lead frame assembly 50 as shown in FIG. 9.

The inner lead fingers 48 are radially spaced with respect to a central lead frame member 52, sometimes referred to as a die paddle or device support plate, and are integrally formed with the connector pins 44. Linking segments of the lead frame assembly 50 are ultimately trimmed away during manufacture, whereby each inner finger lead 48 is electrically connected to a single J-lead connector. Transport side rail strips on the outer perimeter of the lead frame 50 are also cut away during trim and form operations in the last stages of manufacture, after molding has taken place.

The inner tips of the conductive fingers 48 are radially spaced about the die paddle plate 52 in an interconnect region R. The inner tips of the conductive fingers 48 are relatively narrow, and the fingers expand substantially as they radiate outwardly from the base paddle plate 52.

The external J-lead connector pins 44 and inner finger leads 48 are initially coplanar during molding, as shown in FIG. 3. After molding, the connector pin portions 44 are bent through a 90 degree angle along the longitudinal side surfaces of the package during the trim and form operation. However, the inner finger leads 48 and base paddle plate 52 remain coplanar as shown in FIG. 10.

The semiconductor chip package 40 provides a standard external surface mount pattern for electrically connecting the input/output nodes N of the semiconductor chip 12 to conductive lands on a printed circuit board of a host electronic system or on some other semiconductor package. The chip package 40 includes a molded body 54 of non-conductive material, for example a polymer such as polyetherimide or epoxy resin. In this arrangement, the finger lead assembly 50, the semiconductor chip 42, the laminated backup battery 12 and the interconnect media 10 are embedded and encapsulated within the molded body 54.

In one exemplary embodiment, the laminated battery 12 has a contact potential of 2.8 volts DC and an energy capacity of 2 mAhrs-4 mAhrs. Physically, the battery 12 has a substantially rectangular body of 0.350 inch width and a body length of about 0.350 inch, and a height of 0.053 inch. It is essential that the battery 12 be rated for high temperature duty, since it will be exposed to high temperatures during wire bonding and transfer molding. Otherwise, the solid electrolyte core 24 within the laminated battery will melt and the battery charge will be destroyed.

Referring to FIG. 9 and FIG. 10, the semiconductor chip 42 is bonded to the upper surface of the die paddle plate 52 by a conductive deposit of silver-filled epoxy adhesive such as Ablebond TM 84-1. The input/output nodes N are electrically connected to selected conductive fingers 48 by fine gold wires 46 having a diameter of 1.3 mil. Bonding of the gold wires 36 to the conductive fingers 48 and I/O nodes N is preferably by the conventional thermosonic ball bonding technique.

After the interconnect media 10 has been assembled onto the laminated battery 12, the assembled battery package is bonded to the underside of the lead frame assembly, with the die paddle plate 52 being supported directly over the anode aperture 30 as shown in FIG. 9 and FIG. 10.

The negative and positive terminals 14, 20 of the laminated backup battery 12 are then electrically connected by fine gold wires 46N, 46P to the backup battery anode 20 and cathode 14, respectively, prior to encapsulation, preferably by laser welding.

After the chip 42 has been bonded to the die paddle plate 52, the ends of the fine gold wires 46 are then connected between the chip I/O nodes 14 and the respective finger leads 18. A gold wire 46P is bonded between the positive interconnect electrode 20 and the positive backup voltage node 42P of the chip. The negative backup voltage node 42N is electrically connected to the negative interconnect lead 28 by a gold wire 36N.

The lead frame assembly 50 is then placed in a multi-cavity split mold. The mold cavity is closed in a transfer molding machine and a non-conductive encapsulant material such as polyphenolene sulfide is injected in fine pellet form from a nozzle. The pressure at which this injection takes place is closely controlled to prevent damage to the gold wire bonds. Under the appropriate pressure and temperature, the pellets melt and flow into channels within the mold and fill the cavities around the lead frame assembly 50, thereby completely encapsulating the lead frame 50, the laminated backup battery 12, IC chip 42 and gold wires 46. The resin is cured while still in the mold by the applied heat and pressure. Further curing takes place in an oven.

As a result of the foregoing transfer mold procedure, the package 40 is produced in the form of a rectangular molded body 54 of non-conductive resin material. After removal from the mold, the linking segments between adjacent J-leads 44 in the lead frame assembly 20 are cut to separate and electrically isolate the pins and conductive finger leads from one another. Additionally, the transport side rails are also cut and separated from the molded assembly.

The lead frame 50 is a conventional metal alloy, such as a tin-plated nickel or iron alloy or, alternatively, a tin-plated copper alloy such as CDA 194. It will be appreciated that during assembly, the connector pins and inner conductive leads are structurally interconnected by the linking segments and by the side transport side rails, preferably stamped from a continuous metal strip. The connecting sections remain attached to the connector pins for handling purposes only and are severed during trim and form operations in the last stages of manufacture, after molding has taken place.

It will be understood that a selected one of the external J-leads 44 is adapted for connection to a primary power supply node which provides a voltage $V_{cc}$ which is typically at +5.0 volts DC. Similarly, another external connector pin is adapted for connection to a ground node of a host electronic system for providing a ground-reference GND. Other pins are dedicated for true and complement chip select signals, CS and $\overline{CS}$, a signal CLK for synchronously clocking data to and from the monolithic integrated circuit 42, as well as various other I/O signals which are produced by the host electronic circuit. A comparator and switching circuit (not illustrated) compares the voltage $V_{cc}$ from the primary power supply of the host electronic circuit with the voltage of the backup battery 12 and automatically connects the highest detected voltage to power the integrated circuit 42.

Referring again to FIG. 10, the laminated anode terminal 20 and the laminated cathode terminal 22 are not coplanar; consequently, the interconnect media 10 is folded onto the battery anode and cathode for presenting positive and negative battery terminals substantially in coplanar relation for wire bonding interconnection with the power input/output nodes of the semiconductor integrated circuit device 42. Because of the small size of the backup battery 12, it can be easily fitted beneath the die paddle plate 52, with the integrated circuit chip 42 and die paddle plate 52 being supported directly over the anode window aperture 30. A fine gold wire 46P is extended from the positive power input node 42P through the window aperture and is laser bonded directly onto the anode surface 20.

Although the invention has been described with reference to a specific embodiment, and with reference to a specific SRAM backup battery application, the foregoing description is not intended to be construed in a limiting sense. Various modifications of the disclosed laminated battery package and interconnect media as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. An electronic circuit package comprising, in combination:
   a body of insulating material;
   a lead frame assembly encapsulated within said body of insulating material, said lead frame assembly including multiple conductive finger leads and a device support plate;
   an electronic circuit device mounted on said device support plate, said electronic circuit device having positive and negative power nodes;
   a laminated battery having an electrolyte sandwiched between a cathode lamination and an anode lamination, said laminated battery being disposed beneath the device support plate on the underside of the lead frame assembly; and,
   an interconnect media having contact exposure means coupled to the laminated battery anode and cathode for electrically connecting the positive and negative power nodes of the integrated circuit device to the battery anode and cathode laminations.

2. An electronic circuit package as defined in claim 1, wherein said electronic circuit device is an integrated circuit implemented on a semiconductor chip, said integrated circuit having a plurality of input/output nodes and a plurality of wire conductors connecting said input/output nodes to said conductive finger leads, said positive and negative power nodes being electrically connected by said wire conductors to the anode and cathode terminals of said interconnect media.

3. An electronic circuit package as defined in claim 1, wherein said conductive finger leads and the device support plate are substantially coplanar with each other.

4. An electronic circuit package as defined in claim 1, wherein said conductive finger leads are radially spaced about an interconnect region and the device support plate traverses the interconnect region, said electronic circuit device being an integrated circuit implemented on a semiconductor chip, said chip being mounted on and electrically connected to the device support plate.

5. An electronic circuit package as defined in claim 1, said interconnect media comprising a flexible, laminated strip having a central conductive laminate sandwiched between first and second insulation laminates, with a section of the first insulation laminate being removed, thereby exposing the surface of the conductive laminate in electrical engagement with one of the laminated battery electrodes, and the laminated strip being intersected by a first aperture, thereby exposing the other battery electrode, and the second insulation laminate being intersected by a second aperture, thereby exposing the conductive laminate.

6. An interconnect media as defined in claim 5, wherein the central conductive laminate comprises a foil of a conductive metal selected from the group consisting of copper, silver and aluminum.

7. An interconnect media as defined in claim 5, wherein the central conductive laminate comprises a metalized film of a conductive metal selected from the group consisting of copper, silver and aluminum.

8. An interconnect media as defined in claim 5, wherein the insulation laminate comprises paper.

9. An interconnect media as defined in claim 5, wherein the insulation laminate comprises polyester film.

10. An interconnect media as defined in claim 5, wherein the insulation laminates are bonded to the conductive laminate by a heat sealing adhesive.

11. In an electronic circuit package of the type including a lead frame assembly, finger leads and a device support member, an integrated circuit chip mounted on the device support member, said integrated circuit chip having input/output nodes for conducting signals, positive and negative nodes for conducting operating current, and wire conductors electrically connecting the input/output signal nodes to the finger leads, the improvement comprising a laminated secondary cell mounted beneath the device support member, said laminated cell having a cathode lamination, an anode lamination and interconnect media means connecting the anode and cathode laminations in electrical contact with the positive and negative power nodes, respectively.

12. The combination as defined in claim 11, said interconnect media means comprising a central conductive laminate sandwiched between first and second insulation laminates, with a section of the first insulation laminate being removed, said laminated interconnect media being folded about the cathode and anode battery laminations, with one of the battery laminations being mounted in electrical contacting engagement against the exposed surface of the conductive interconnect laminate, with the other battery electrode being covered by the opposite end of the interconnect media.

13. The combination as defined in claim 11, the opposite end of the interconnect media being intersected by a first aperture, thereby exposing a selected one of the anode and cathode laminations, and the second insulation laminate being intersected by a second aperture, thereby exposing the conductive laminate, said exposed laminates being connected to selected input/output nodes by wire conductors.

14. An electronic circuit package comprising, in combination:
   a molded body of insulating material;
   a lead frame assembly encapsulated within said body of insulating material, said lead frame assembly including multiple conductive finger leads and a die paddle;
   an electronic circuit device mounted on said die paddle, said electronic circuit device having positive and negative input power nodes;
   a laminated battery mounted on said lead frame assembly beneath said die paddle, said laminated battery having an electrolyte core sandwiched between a cathode lamination and an anode lamination;
   a laminated interconnect media having a central conductive laminate sandwiched between first and second insulation laminates, with a section of the first insulation laminate being removed, said laminated interconnect media being folded about the cathode and anode battery laminations, with a selected one of the battery anode and cathode laminations being mounted in electrical contacting engagement against the exposed surface of the conductive laminate, and the other battery lamination being overlapped by the opposite end of the interconnect media; and,
   a plurality of wire conductors coupled to the interconnect media and to the positive and negative input power nodes.

15. An electronic circuit package as defined in claim 1, said interconnect media comprising a flexible, laminated strip having a central conductive laminate sandwiched between first and second insulation laminates, with a section of the first insulation laminate being removed, thereby exposing the surface of the conductive laminate in electrical engagement with one of the laminated battery electrodes, and the laminated strip being intersected by a first aperture for exposing the other battery electrode, and the second insulation laminate being intersected by a second aperture, thereby exposing the conductive laminate.

* * * * *